United States Patent
Natsuaki et al.

(10) Patent No.: US 10,566,489 B2
(45) Date of Patent: Feb. 18, 2020

(54) PHOTOSENSOR

(71) Applicant: SHARP KABUSHIKI KAISHA, Sakai, Osaka (JP)

(72) Inventors: Kazuhiro Natsuaki, Sakai (JP); Takahiro Takimoto, Sakai (JP); Masayo Uchida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/304,284

(22) PCT Filed: May 26, 2017

(86) PCT No.: PCT/JP2017/019698
§ 371 (c)(1),
(2) Date: Nov. 24, 2018

(87) PCT Pub. No.: WO2017/204331
PCT Pub. Date: Nov. 30, 2017

(65) Prior Publication Data
US 2019/0109255 A1    Apr. 11, 2019

(30) Foreign Application Priority Data

May 26, 2016  (JP) ................ 2016-104944

(51) Int. Cl.
*H01L 27/14*    (2006.01)
*H01L 31/00*    (2006.01)
(Continued)

(52) U.S. Cl.
CPC .......... *H01L 31/153* (2013.01); *G01S 17/026* (2013.01); *G02B 5/284* (2013.01);
(Continued)

(58) Field of Classification Search
CPC ............... H01L 31/18; H01L 27/14643; H01L 2924/12042; H01L 2924/14;
(Continued)

(56) References Cited

U.S. PATENT DOCUMENTS

2006/0056780 A1*  3/2006  Takai .................. G02B 6/4201
                                                      385/92
2013/0327931 A1   12/2013  Hsu et al.
2018/0360352 A1*  12/2018  Ohno .................. A61B 5/0245

FOREIGN PATENT DOCUMENTS

JP    2006-040913 A    2/2006
JP    2010-258350 A    11/2010
JP    2011-049473 A    3/2011

\* cited by examiner

*Primary Examiner* — Theresa T Doan
(74) *Attorney, Agent, or Firm* — ScienBiziP, P.C.

(57) ABSTRACT

A photosensor includes a light emitting element that radiates light onto an object to be detected and a light receiving element that has a light-receiving surface for receiving light radiated from the light emitting element. An incident light regulation portion covering the light-receiving surface is provided on a path along which the light radiated from the light emitting element directed toward the light-receiving surface, and the incident light regulation portion transmits light having an incident angle less than a predetermined value and blocks light having the incident angle greater than or equal to the predetermined value among light incident on the light receiving element.

5 Claims, 7 Drawing Sheets

(51) Int. Cl.
*H01L 31/153* (2006.01)
*G02B 5/28* (2006.01)
*H01L 31/107* (2006.01)
*H01L 31/0216* (2014.01)
*H01L 31/173* (2006.01)
*H01L 31/103* (2006.01)
*G01S 17/02* (2006.01)
*H01L 31/0203* (2014.01)

(52) U.S. Cl.
CPC .... *H01L 31/0203* (2013.01); *H01L 31/02164* (2013.01); *H01L 31/02165* (2013.01); *H01L 31/103* (2013.01); *H01L 31/107* (2013.01); *H01L 31/173* (2013.01)

(58) Field of Classification Search
CPC ....... H01L 2924/12041; H01L 31/0203; H01L 31/02327; H01L 31/0232
USPC ........................................................ 257/431
See application file for complete search history.

PHOTOSENSOR

TECHNICAL FIELD

This application is based upon and claims the benefit of priority from Japanese Patent Application No. 2016-10494 filed May 26, 2016, the entire contents of which are incorporated herein by reference.

The present invention relates to a photosensor.

BACKGROUND ART

In recent years, an electronic device such as a smartphone or a tablet is provided with, for example, a proximity sensor which is used for detecting approach of a face of a user and automatically turning off a power supply of a display. Also, an autofocus system in a camera or an automatic robot such as a robot cleaner is provided with a distance measurement sensor used for distance or position detection.

A proximity sensor is an optical sensor for detecting an object to be detected at a short distance and in general, a photodiode which performs a detection determination with an optical current generated by receiving light is used as a light receiving element. In the distance measurement sensor, SPAD is generally used, is an optical sensor for detecting an object to be detected at a distance farther than the proximity sensor, The SPAD is a kind of photodiode used in a state where avalanche breakdown occurs by applying a voltage equal to or higher than a breakdown voltage, and is characterized by having a high amplification factor of 10,000 to 1,000,000 times for incident photocarriers and high sensitivity enough to detect a single photon. For that reason, it is possible to perform minute light detection in which light of the light emitting element which is reflected from the object to be detected at a long distance and returned is detected, and it is possible to detect the object to be detected which is 1 m or more away. Common to these devices is a point that these devices have a light emitting element and a light receiving element and detect the reflected light from the object to be detected to detect presence or absence or the distance of the object to be detected.

Examples of such a photosensor include one described in PTL 1. The photosensor of PTL 1 includes a light emitting element and a light receiving element, and a diffraction grating is provided on a path of light radiated from the light emitting element, reflected by a light-transmitting plate, and directed toward the light receiving element so that intensity of light directed toward the light receiving element without being reflected by the object to be detected, among the light radiated from the light emitting element, is reduced.

CITATION LIST

Patent Literature

PTL 1: Japanese Unexamined Patent Application Publication No. 2011-49473

SUMMARY OF INVENTION

Technical Problem

However, in the photosensor, since designing of the diffraction grating is performed for light of a specific wavelength, for example, in a case where the light emitting element radiates light of a wavelength in a predetermined band, intensity of light having a wavelength different from the designed specific wavelength cannot be appropriately reduced in some cases. For that reason, there is a case where the intensity of light radiated from the light emitting element and directed toward the light receiving element without being reflected by the object to be detected cannot be reduced and detection accuracy cannot be sufficiently enhanced.

Accordingly, an object of the present invention is to provide a photosensor capable of detecting information on an object to be detected with high accuracy even in a case where a light emitting element that radiates light having a wavelength in a predetermined band is used.

Solution to Problem

A photosensor according to one aspect of the present invention includes a light emitting element that radiates light onto an object to be detected, and a light receiving element that has a light-receiving surface for receiving light radiated from the light emitting element, in which an incident light regulation portion covering the light-receiving surface is provided on a path along which the light radiated from the light emitting element is directed toward the light-receiving surface, and the incident light regulation portion transmits light having an incident angle less than a predetermined value and blocks light having the incident angle greater than or equal to the predetermined value among light incident on the light receiving element.

Advantageous Effects of Invention

According to the photosensor of the aspect described above, among the light radiated from the light emitting element and incident on the light receiving element, light having an incident angle less than the predetermined value is transmitted through the incident light regulation portion and is incident on the light-receiving surface of the light receiving element and light having an incident angle greater than or equal to the predetermined value is blocked by the incident light regulation portion. For that reason, for example, even in a case where a light emitting element that radiates light having a wavelength in a predetermined band is used, intensity of light of wavelengths in ail the bands radiated from the light emitting element and directed toward the light receiving element without being reflected by the object to be detected can be reduced. As a result, information on the object to be detected can be detected with high accuracy.

DESCRIPTION OF EMBODIMENTS

Hereinafter, an embodiment of the present invention will be described with reference to the accompanying drawings. In the following description, terms (for example, terms including "upper", "lower", "right", "left", "side", and "and") indicating a specific direction or position are used as necessary, but the use of these terms is intended to facilitate understanding of the invention with reference to the drawings and the technical scope of the present invention is not limited by the meaning of these terms. Also, the following description is merely exemplary in nature and is not intended to limit the present invention, its application, or its use. Furthermore, the drawings are schematic ones, and ratios of each dimension or the like do not necessarily agree with actual ones.

(First Embodiment)

Figure 1:
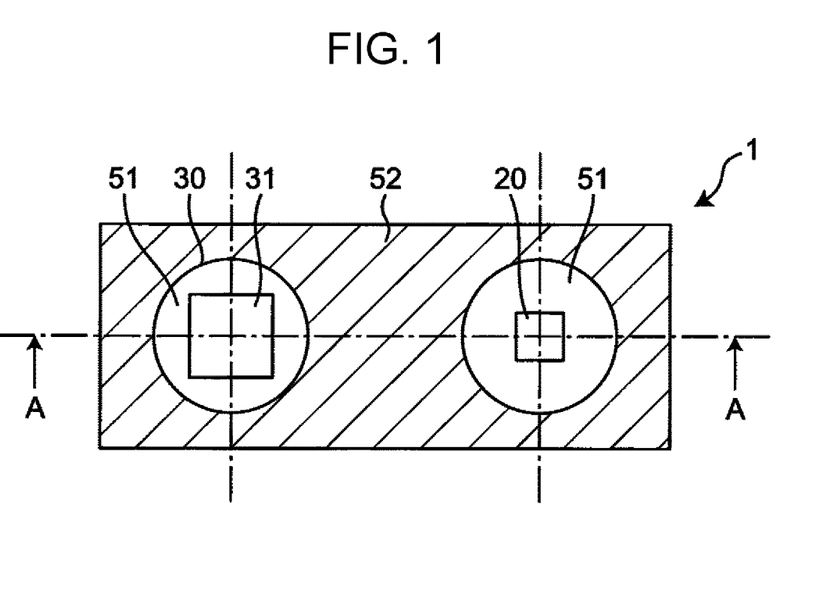
FIG. 1 is a top view of an optical sensor of a first embodiment of the present invention.
Figure 2:
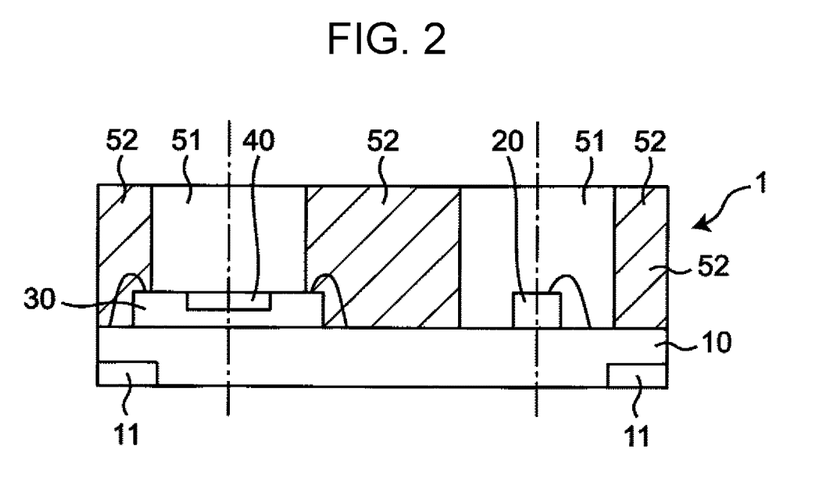
FIG. 2 is a cross-sectional view taken along line A-A in Fig, 1.

As illustrated in FIGS. 1 and 2, an optical sensor 1 according to a first embodiment of the present invention includes a sensor substrate 10, and a light emitting element 20 and a light receiving unit 30 that are disposed on the sensor substrate 10 with a space therebetween. In this optical sensor 1, the light emitting element 20 and a light receiving element 40 are sealed with light-transmitting resin 51. Regions around the light emitting element 20 and the light receiving element 40 are sealed with light-blocking resin 52.

The sensor substrate 10 is, for example, ceramics, and a terminal 11 is provided on the bottom surface thereof. Ceramics has properties that its coefficient of thermal expansion is smaller than that of a resin substrate and is less likely to warp. An etalon filter 60 of the light receiving element 40, which will be described later, may crack due to warping when a large stress is applied. For that reason, the sensor substrate 10 is made of ceramic which has a small coefficient of thermal expansion and is less likely to warp, thereby preventing cracking of the etalon filter 60.

The light emitting element 20 is, for example, an LED or a laser having a wavelength region WR having a peak at 850 nm, and is connected to the sensor substrate 10 by wire bonding.

The light receiving unit 30 is an LSI chip having the light receiving element 40 built therein, and is connected to the sensor substrate 10 by wire bonding.

Figure 3:
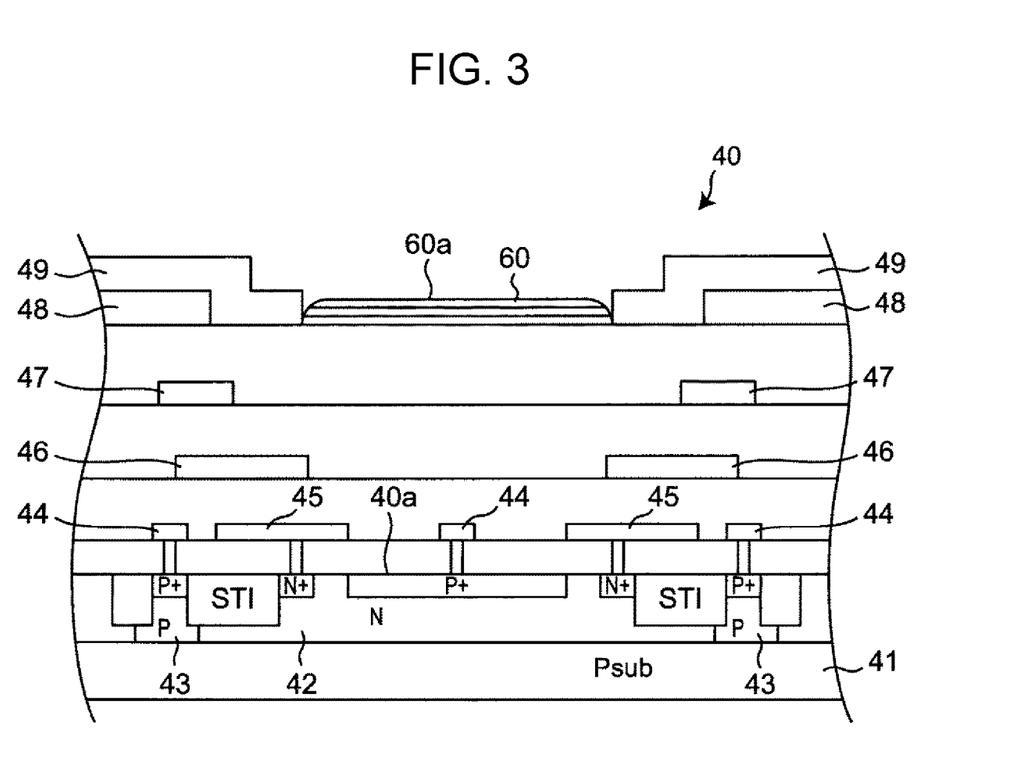
FIG. 3 is an enlarged view of a light receiving element portion in FIG. 2.

As illustrated in FIG. 3, the light receiving element 40 is configured with a semiconductor substrate 41, an N-type semiconductor layer 42 and a P-type semiconductor layer 43 that are provided on the semiconductor substrate 41, a P+ diffusion layer 44 serving as anode diffusion and an N+ diffusion layer 45 serving as cathode diffusion that are provided over the N-type semiconductor layer 42 and the P-type semiconductor layer 43, first to third conductive films 46 to 48 provided over the P+ diffusion layer 44 and the N+ diffusion layer 45, and a passivation film 49 provided on the third conductive film 48.

The semiconductor substrate 41 is, for example, a P-type (100) silicon substrate having resistivity of 10 Ω·cm.

The N-type semiconductor layer 42 is formed by ion-implanting 31P+ (phosphorus) of approximately $1.0E+13$ $cm^{-3}$ at 150 keV and performing heat treatment such as annealing at 900° C. The P-type semiconductor layer 43 is similarly formed by ion-implanting 11B+ (boron) of approximately $1.0E+13$ $cm^{-3}$ at 250 keV and performing heat treatment such as annealing at 900° C. The P-type semiconductor layer 43 is disposed so as to sandwich the N-type semiconductor layer 42 from both sides.

The P+ diffusion layer 44 is formed by ion-implanting 11B+ (boron) of approximately $2.0E+15$ $cm^{-3}$ at 30 keV and performing rapid thermal anneal (RTA) at 1000° C. for 30 seconds. The N+ diffusion layer 45 is similarly formed by ion-implanting 31P+ (phosphorus) of approximately $1.0E+15$ $cm^{-3}$ at 50 keV and performing RTA at 1000° C. for 30 seconds. With this configuration, a FN junction is formed between the P+ diffusion layer 44 and the N-type semiconductor layer 42 and functions as a photodiode. The region functioning as the photodiode is a light-receiving surface 40a.

A silicon oxide film (not illustrated) formed by thermal oxidation or the like is provided between the P+ diffusion layer 44 and N+ diffusion layer 45 and the N-type semiconductor layer 42 and P-type semiconductor layer 43. In addition, a silicon oxide film serving as a field film is formed on the P+ diffusion layer 44 and the N+ diffusion layer 45 by chemical vapor deposition (CVD), chemical mechanical polishing (CMP), or the like.

The first conductive film 46 is made of AlCu having a thickness of 50 nm, is provided on the silicon oxide film on the P+ diffusion layer 44 and the N+ diffusion layer 45, and serves as an anode wiring and a cathode wiring. On the first conductive film 46, a silicon oxide film serving as an insulating film having a thickness of approximately 1000 nm is formed by the CVD, CMP or the like.

The second conductive film 47 is made of AlCu having a thickness of approximately 500 nm and is provided on the silicon oxide film on the first conductive film 46. On the second conductive film 47, a silicon oxide film serving as an insulating film having a thickness of approximately 1000 nm is formed by the CVD, CMP or the like.

The third conductive film 48 is made of AlCu having a thickness of approximately 2 μm and is provided on the silicon oxide film on the second conductive film 47. The third conductive film 48 functions as a light blocking film and is disposed so as not to make light incident on a region other than a region facing the light-receiving surface 40a of the light receiving element 40.

The passivation film 49 is made of, for example, $Si_3N_4$, and is provided on the silicon oxide film on the second conductive film 47 and on the third conductive film 48. An opening is provided in a region, of the passivation film 49, facing the light-receiving surface 40a. Since a refractive index (2) of $Si_3N_4$ is higher than that (1.46) of $SiO_2$, it is possible to reduce variations in reflectance by providing the opening in the region facing the light-receiving surface 40a.

The light receiving element 40 includes the etalon filter 60 as an example of an incident light regulation portion. The etalon filter 60 is provided in the region facing the light-receiving surface 40a on the silicon oxide film on the second conductive film 47, and is disposed so that its upper surface 60a is parallel to the light-receiving surface 40a and covers the light-receiving surface 40a.

The etalon filter 60 includes metal films (Ag) having a thickness of 30 nm and a dielectric film ($Si_3N_4$) having a thickness of 160 nm sandwiched between the metal films. The etalon filter 60 is formed by forming a lift-off resist in a region other than the region facing the light-receiving surface 40a, forming an $Ag/Si_3N_4/Ag$ film by a sputtering method or a vapor deposition method, then immersing the film in resist stripping liquid to remove the resist.

That is, the etalon filter 60 is a wavelength filter utilizing multiple interferences of two facing reflecting surfaces. Since light incident on the etalon filter has a different optical path length in the dielectric depending on an incident angle θ (illustrated in FIG. 5), transmittance varies in accordance with the incident angle θ.

Figure 4:
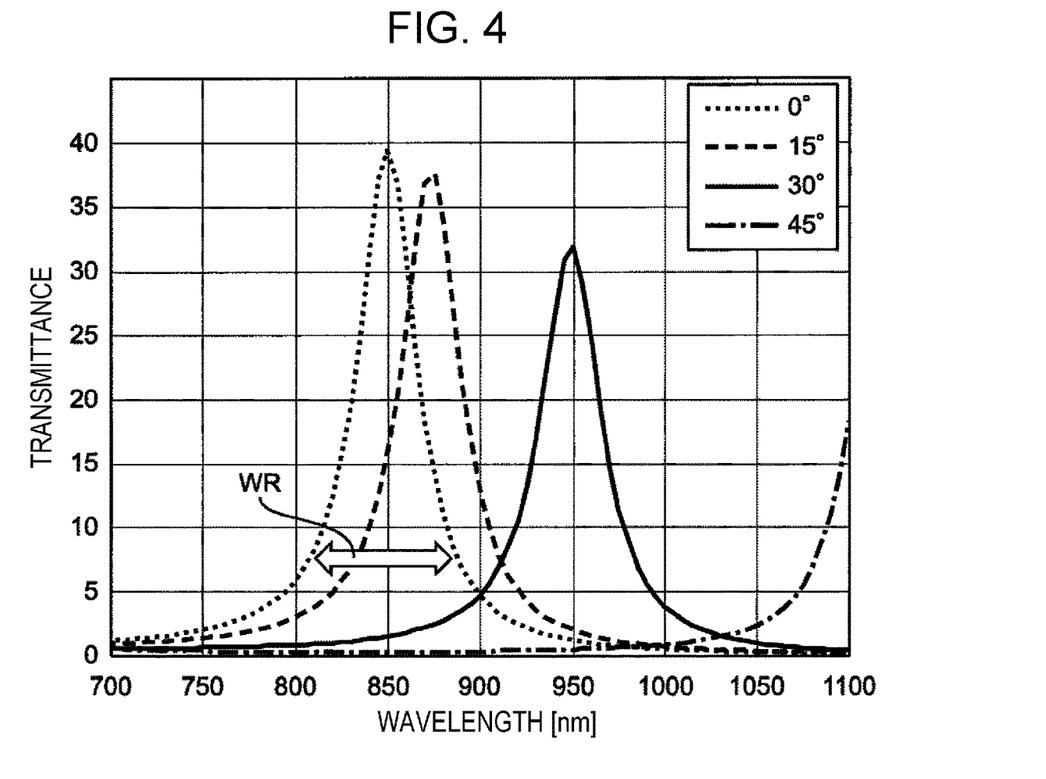
FIG. 4 is a view for explaining a relationship between an incident angle of light to an etalon filter of the optical sensor in FIG. 1 and transmittance thereof.

For example, as illustrated in FIG. 4, in a case where a laser having a wavelength region WR having a peak at 850 nm is used as the light emitting element, when the incident angle θ is 0 degrees (direction perpendicular to the upper surface 60a of the etalon filter 60), the transmittance becomes the highest when light having a wavelength of 850 nm is incident, and transmittance of light is approximately 40%. In a case where the incident angle θ is 15 degrees, the transmittance is highest when light having a wavelength of approximately 875 nm is incident, and the transmittance of light having the wavelength of 850 nm is approximately 16%. In a case where the incident angle θ is 30 degrees, the transmittance becomes highest when light having a wavelength of approximately 950 nm is incident, and the transmittance of light having the wavelength of 850 nm is approximately 2%. In a case where the incident angle θ is 45 degrees, the transmittance becomes the highest when light having a wavelength of approximately 1150 nm is incident, and the transmittance of light having the wavelength of 850 nm is substantially zero %.

If the transmittance of the etalon filter 60 is equal to or less than 2%, intensity of the light transmitted through the etalon filter 60 can be sufficiently reduced, and even if light is incident on the light-receiving surface 40a, there is almost no possibility that the light receiving element malfunctions. That is, in the photosensor 1 of the first embodiment, an incident angle θ (hereinafter, referred to as a regulation angle $θ_0$) at which light incident on the light receiving element 40 can be blocked is 45 degrees ($θ<θ_0$... light transmission, $θ≥θ_0$... light blocking).

If the etalon filter 60 is provided in a state where the third conductive film 48 is not separated from the region facing the light-receiving surface 40a by a certain distance or more, distortion occurs in the etalon filter 60. For that reason, it is preferable that the third conductive film 48 is disposed to be separated from a boundary of the region facing the light-receiving surface 40a by at least a thickness of an interference film.

Figure 5:
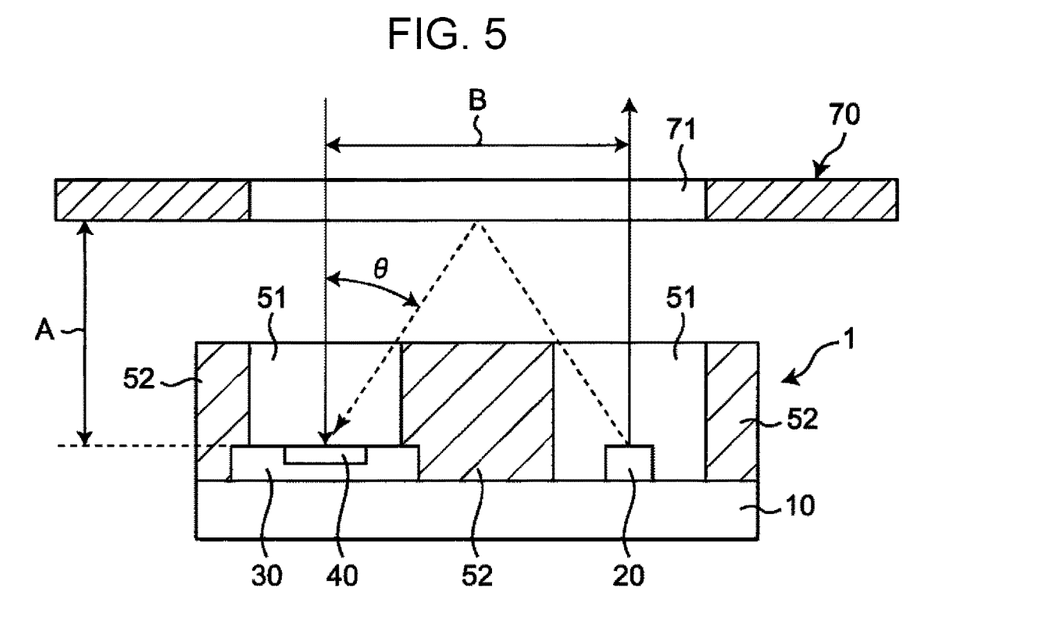
FIG. 5 is a schematic cross-sectional view illustrating an example of an electronic device including the optical sensor in FIG. 1.

As illustrated in FIG. 5, in the electronic device such as a smartphone, the photosensor 1 is disposed inside a casing 70 of the electronic device so that the light emitting element 20 and the light receiving element 40 face a transparent casing window 71.

Light radiated from the light emitting element 20 of the photosensor 1 and reflected by the object to be detected forms an angle of approximately 90 degrees ($θ≈0$) with the light-receiving surface 40a of the light receiving element 40 and is incident on the light receiving element 40. However, part of light emitted from the side of the light emitting element 20 strikes the casing 70 instead of the object to be detected, is reflected, and travels toward the light receiving element 40.

Figure 6:
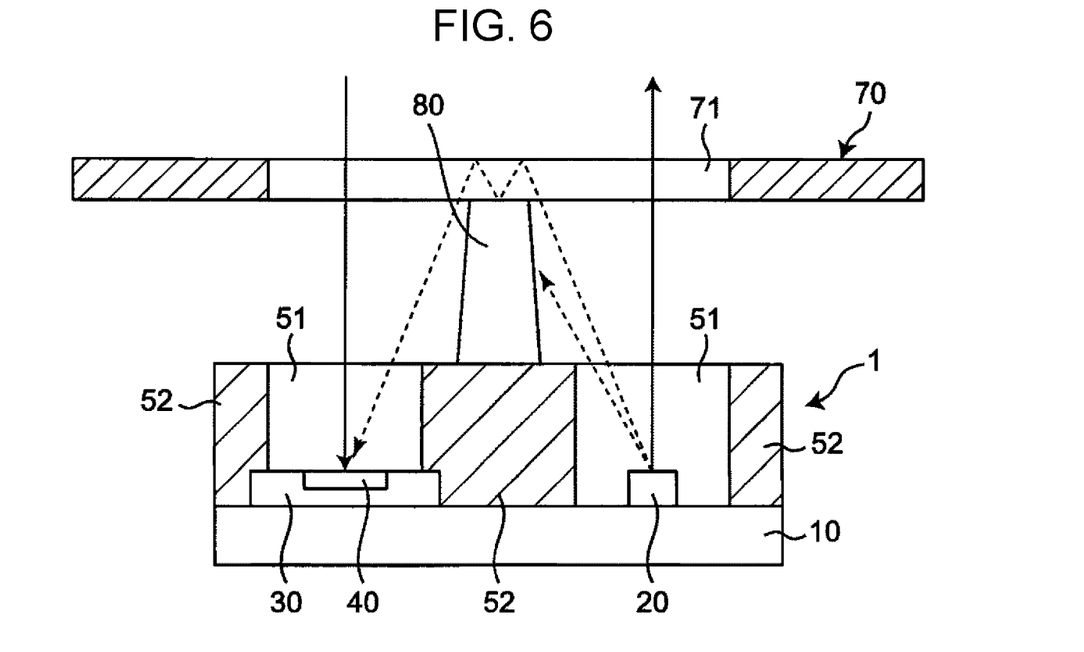
FIG. 6 is a schematic cross-sectional view illustrating another example of the electronic device including the optical sensor in FIG. 1.

In order to prevent such light from being made incident on the light receiving element 40, for example, as illustrated in FIG. 6, a method of providing, between the light emitting element 20 and the light receiving element 40, a rubber cap 80 for covering a gap between the top surface of the photosensor 1 and the casing 70 is conceivable.

However, in this case, since the distance between the photosensor 1 and the casing 70 varies according to the type of the electronic device, it is necessary to design the rubber cap 80 for each mounted model, and since facilities and processes for providing the rubber cap 80 are required, the manufacturing cost is increased.

As illustrated in FIG. 6, part of the light radiated from the light emitting element 20 intrudes into the casing window 71, is multiple reflected, and then travels toward the light receiving element 40, so that it is impossible to avoid erroneous detection due to light directed to the light receiving element without being reflected by the object to be detected.

In the optical sensor 1 of the first embodiment, among the light which is radiated from the light emitting element 20 and is incident on the light receiving element 40, light having an incident angle θ less than to a regulation angle $θ_0$ is transmitted through the etalon filter 60, and light having an incident angle greater than or equal to the regulation angle $θ_0$ is blocked by the etalon filter 60.

For example, the light reflected by the object to be detected is incident on the light receiving element 40 at the incident angle θ which is approximately zero degrees. In this case, as illustrated in FIG. 4, at 850 nm which is the peak wavelength of the laser, transmittance is approximately 40%, and the light reflected by the object to be detected is transmitted through the etalon filter 60 and is incident on the light-receiving surface 40a. Light reflected by the casing 70 at a distance closer than the object to be detected is incident on the light receiving element 40 at the incident angle θ which is approximately 45 degrees. In this case, as illustrated in FIG. 4, transmittance is significantly lower than 5% at the wavelengths (approximately 820 to 880 nm) in all the bands of the laser, and particularly, at 850 nm which is the peak wavelength of the laser, the transmittance is almost zero. For that reason, light of wavelengths in all the bands reflected by the casing 70 is blocked by the etalon filter 60, and intensity of the light is reduced.

That is, in the photosensor 1, even in a case where the light emitting element 20 such as a laser that radiates light having a wavelength in a predetermined band is used, it is possible to reduce the intensity of light of wavelengths in all bands radiated from the light emitting element 20 toward the light receiving element 40 without being reflected by the object to be detected. As a result, information on the object to be detected can be detected with high accuracy.

In addition, the etalon filter 60 is used as the incident light regulation portion. With this configuration, it is possible to reduce the thickness of the incident light regulation portion, eliminate a problem such as warping, and it is possible to suppress the cost.

As the light emitting element 20, a laser is used. In the laser, since primary reflection light has the highest intensity, detection accuracy can be improved efficiently by designing the etalon filter 60 so that the primary reflection light directed toward the light receiving element without being reflected by the object to be detected can be blocked.

In the electronic device including the photosensor 1 illustrated in FIG. 5, the regulation angle $\theta_0$ is calculated by the following expression. Here, A denotes a distance between surfaces of the light receiving element 40 and the casing 70 and B denotes a distance between the centers of the light emitting element 20 and the light receiving element 40.

$$\theta_0 = \tan^{-1}(B/A)$$

(Second Embodiment)

Figure 7:
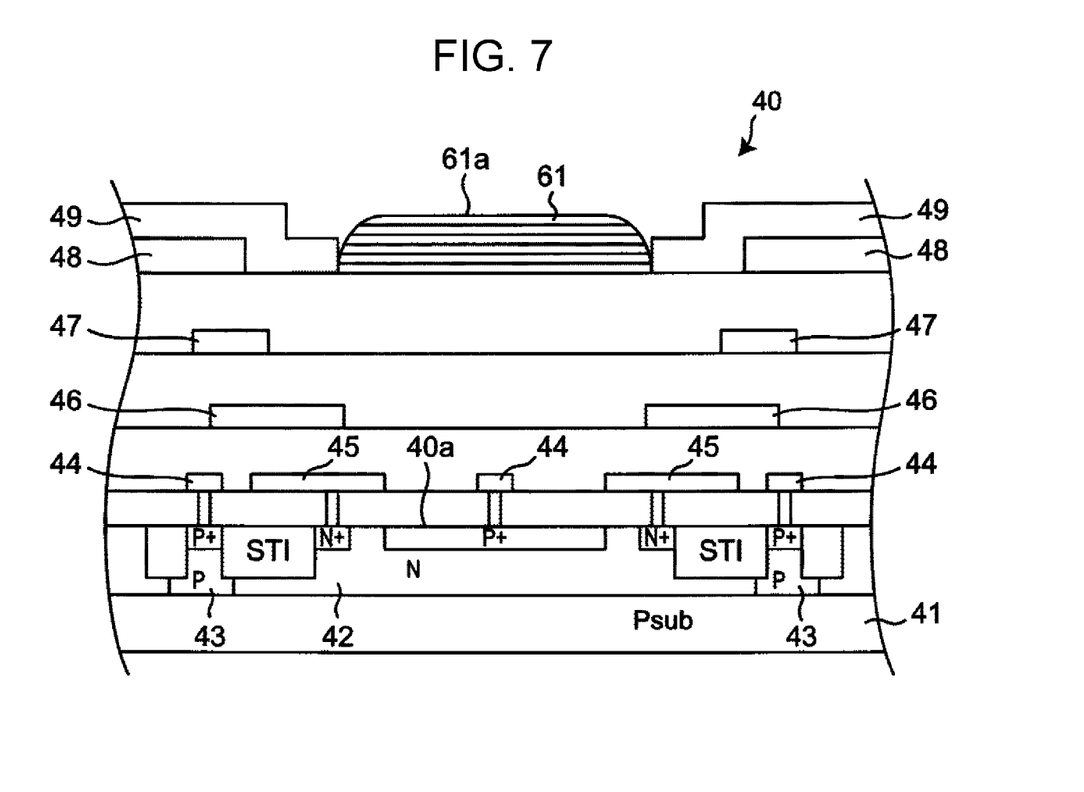
FIG. 7 is an enlarged view of a light receiving element portion of an optical sensor of a second embodiment of the present invention.

The photosensor 1 of a second embodiment of the present invention is different from the photosensor 1 of the first embodiment in that as illustrated in FIG. 7, a dielectric multilayer film 61 in which a plurality of dielectric films are laminated is provided as the incident light regulation portion.

The dielectric multilayer film 61 is configured with 40 dielectric films ($Nb_2O_3/SiO_2$). The dielectric multilayer film 61 is formed by forming a lift-off resist in a region other than the region facing the light-receiving surface 40a, forming a dielectric film by a sputtering method or a vapor deposition method, and immersing the film in resist stripping liquid to remove the resist. The 40 dielectric films have different film thicknesses and are designed to have a transmitting region at 850 nm.

That is, the dielectric multilayer film 61 is a bandpass filter that transmits only light in a specific band by laminating a plurality of dielectric films such as metal oxide films. Light incident on the dielectric multilayer film 61 has different optical path lengths in respective dielectrics depending on the incident angle $\theta$, so that transmittance varies in accordance with the incident angle $\theta$.

Figure 8:
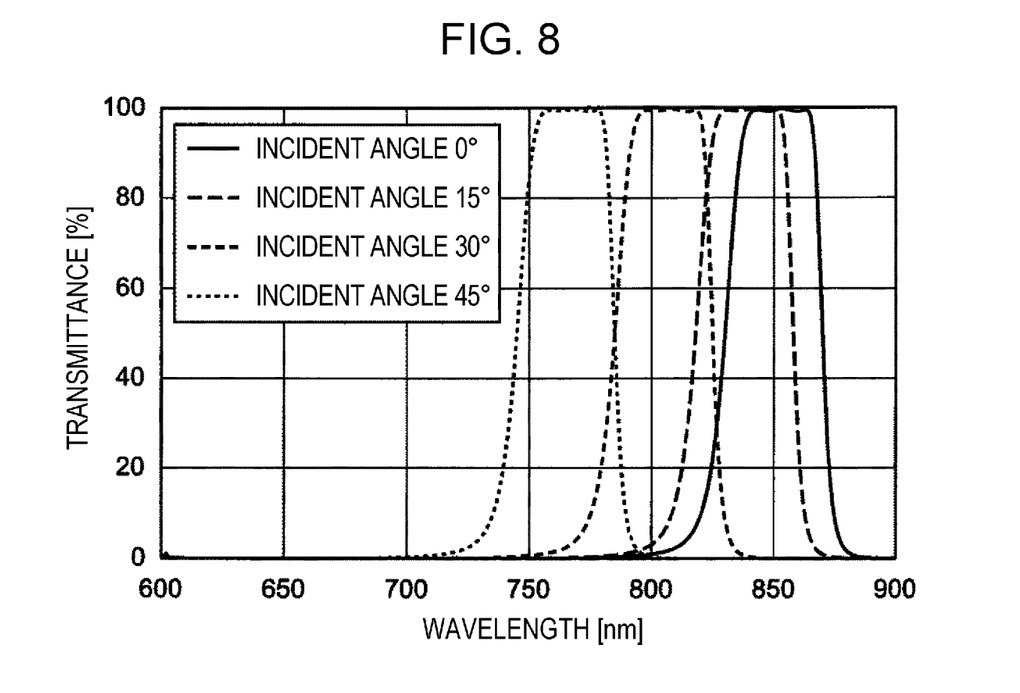
FIG. 8 is a view for explaining a relationship between an angle of incident of light on a dielectric multilayer film of the optical sensor in FIG. 7 and transmittance thereof.

For example, as illustrated in FIG. 8, in a case where a laser having the wavelength region WR having a peak at 850 nm is used as the light emitting element, when the incident angle $\theta$ is 0 degrees (direction perpendicular to an upper surface 61a(illustrated in FIG. 7) of the dielectric multilayer film. 61), the transmittance of light having a wavelength of 850 nm is approximately 99%. When the incident angle $\theta$ is 15 degrees, the transmittance of light having the wavelength of 850 nm is approximately 99%. When the incident angle $\theta$ is 30 degrees, the transmittance of light having the wavelength of 850 nm is approximately almost zero. When the incident angle $\theta$ is 45 degrees, the transmittance of light having the wavelength of 850 nm is approximately almost zero.

If the transmittance of the dielectric multilayer film 61 is less than or equal to 2%, intensity of the light transmitted through the dielectric multilayer film 61 can be sufficiently reduced, and even if the light is incident on the light-receiving surface 40a, there is almost no possibility that the light receiving element malfunctions. That is, in the optical sensor 1 of the second embodiment, the regulation angle $\theta_0$ is 30 degrees ($\theta < \theta_0$... light transmission, $\theta \geq \theta_0$... light blocking).

Thus, by using the dielectric multilayer film 61 as the incident light regulation portion, it is possible to design a cut-off waveform to be steep, and since a cut-off wavelength and a transmission wavelength can be clearly distinguished, an S/N ratio of the sensor can be improved.

The dielectric film of the dielectric multilayer film 61 is not limited to $Nb_2O_3/SiO_2$, and $TiO_2$, $Si_3N_4$, or the like can be appropriately selected depending on the design of the transmitting region.

(Third Embodiment)

An avalanche photodiode may be used as the light receiving element 40. Detection accuracy can be enhanced by using the avalanche photodiode with high light receiving sensitivity as the light receiving element 40.

(Fourth Embodiment)

The photosensor 1 is characterized in that it has "an incident light regulation portion that transmits light having a small incident angle $\theta$ and blocks light having a large incident angle $\theta$", and it goes without saying that the photosensor 1 may have a configuration including this technical idea.

Figure 9:
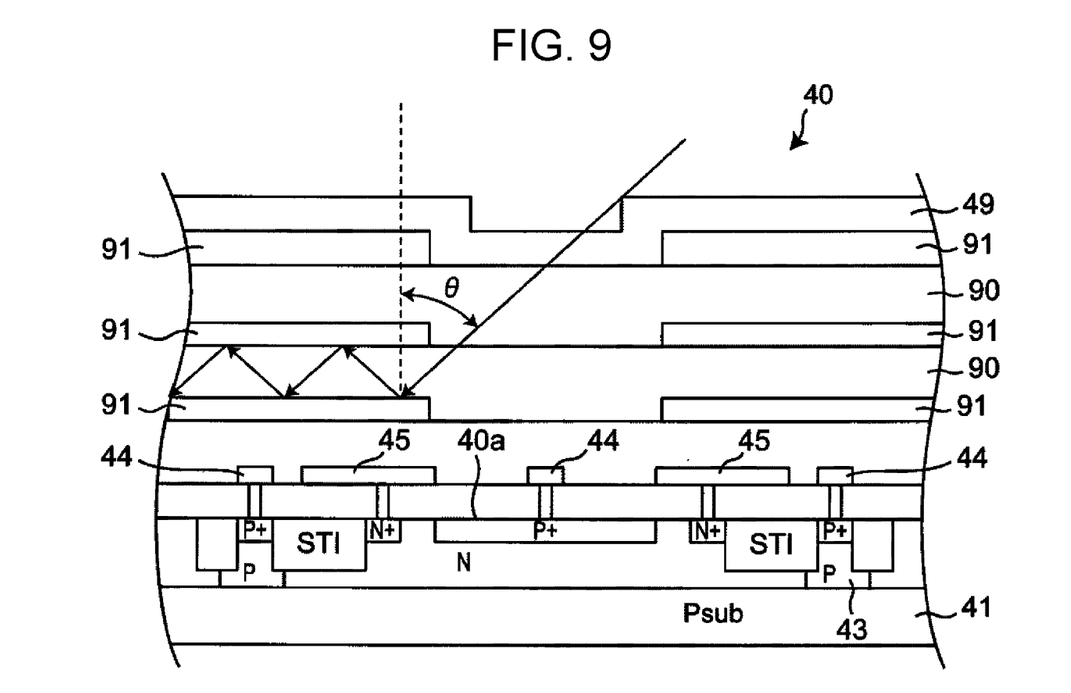
FIG. 9 is a cross-sectional view of a light receiving element portion of an optical sensor of a fourth embodiment of the present invention.

For example, as illustrated in FIG. 9, as the incident light regulation portion, a filter including a dielectric film 90 provided with an optical pocket for guiding light having a predetermined incident angle $\theta$ or more to the side surface and a metal film 91 covering upper and lower surfaces of the dielectric film 90 may be used. This filter is configured so that light, which is incident at a predetermined incident angle $\theta$, enters between metal films 91 and does not come back. With this configuration, it is possible for the photosensor 1 to have a structure in which light larger than the predetermined incident angle $\theta$ is blocked so that it is not considered as light sensitivity.

(Fifth Embodiment)

It goes without saying that the photosensor 1 according to the first to fourth embodiments can be applied to a reflective photosensor, such as a TOF sensor using a laser and a proximity sensor/photo-interrupter/document size sensor using an LSD, with a glass or a film which is interposed between the sensor and an object.

(Six Embodiment)

Figure 10:
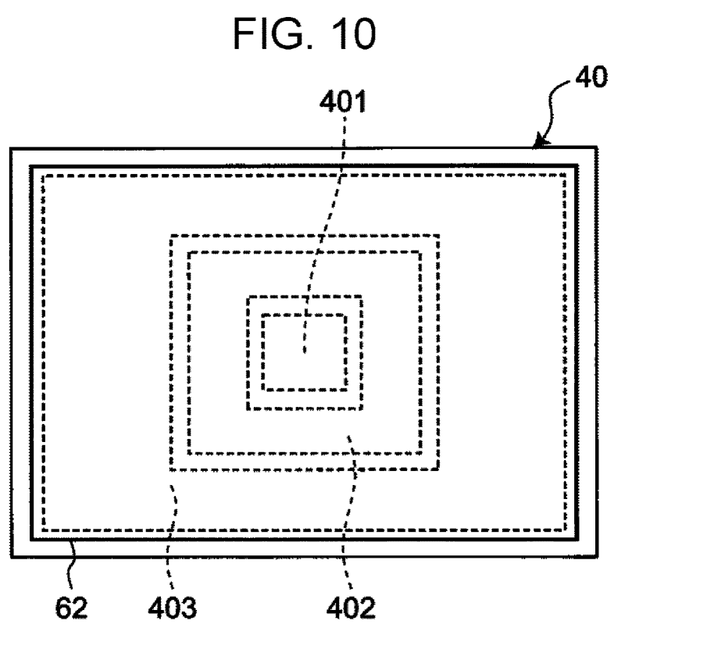
FIG. 10 is a top view of a light receiving element portion of an optical sensor of a sixth embodiment of the present invention.

The photosensor 1 of the sixth embodiment of the present invention is different from the photosensor 1 of the first embodiment in that as illustrated in FIG. 10, the light receiving element 40 includes a sensor portion 401, a first circuit portion 402, and a second circuit portion 403, and an inorganic film filter 62 as an incident light regulation portion is disposed so as to cover the sensor portion 401, the first circuit portion 402, and the second circuit portion 403.

The sensor portion 401 is configured with the semiconductor substrate 41, the N-type semiconductor layer 42 and the P-type semiconductor layer 43 that are provided on the semiconductor substrate 41, the P+ diffusion layer 44 serving as anode diffusion and the N+ diffusion layer 45 serving as cathode diffusion that are provided over the N-type semiconductor layer 42 and the P-type semiconductor layer 43, the first to third conductive films 46 to 48 provided over the P+ diffusion layer 44 and the N+ diffusion layer 45, the passivation film 49 provided on the third conductive film 43, and includes the light-receiving surface 40a.

Each of the first circuit portion 402 and the second circuit portion 403 is formed by a semiconductor process using silicon. The first circuit portion 402 is disposed around an imaginary straight line orthogonal to the light-receiving surface 40a of the sensor portion 401 and on the outer periphery of the sensor portion 401 with a space from the sensor portion 401. The second circuit portion 403 is disposed around the imaginary straight line orthogonal to the light-receiving surface 40a of the sensor portion 401 and on the outer periphery of the first circuit portion 402 with a space from the first circuit portion 402.

The inorganic film filter 62 is made of $SiO_2/Nb_2O_2$ or $SiO_2/Ag$, for example, and has a substantially rectangular shape in a plan view along a direction orthogonal to the light-receiving surface 40a of the sensor portion 401. The inorganic film filter 62 is provided so as to cover substantially the entire surface of the light receiving element 40 excluding an electrode portion (not illustrated) called a PAD portion, that is, cover the entire surface of the sensor portion 401, the first circuit portion 402, and the second circuit portion 403.

Figure 12:
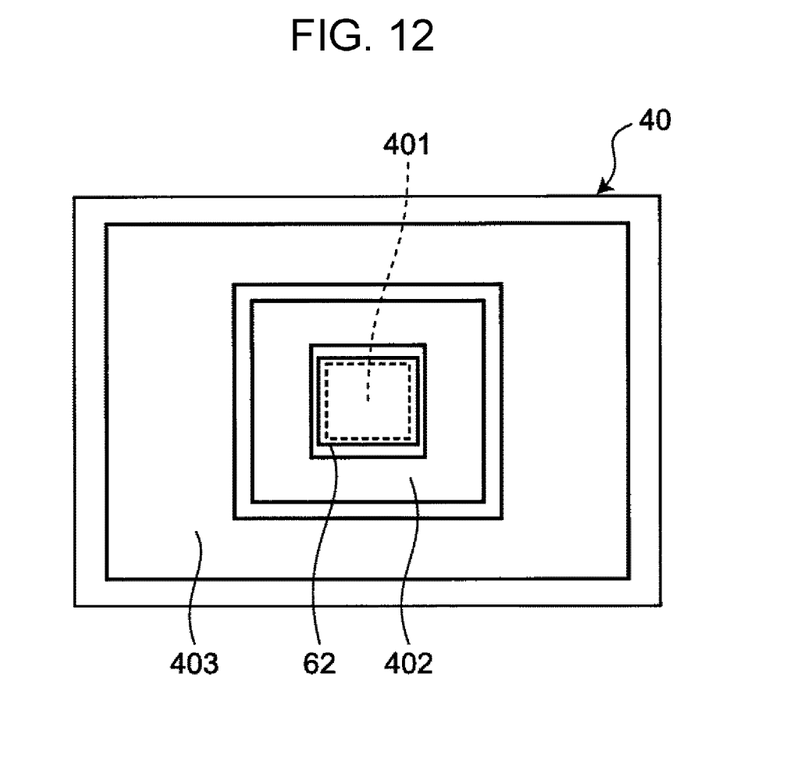
FIG. 12 is a top view illustrating a comparative example of the optical sensor in FIG. 10.

Meanwhile, since the inorganic film filter 62 made of SiO$_2$/Nb$_2$O$_2$ or SiO$_2$/Ag and the first circuit portion 402 and the second circuit portion 403 which are made of silicon have different thermal expansion coefficients, as illustrated in FIG. 12, in a case where the inorganic film filter 62 covers only the sensor portion 401 and the vicinity thereof without covering the first circuit portion 402 and the second circuit portion 403 of the light receiving element 40, there is a possibility that the following problems occur.

(1) Since stress is applied by the "inorganic film" to the first circuit portion 402 and the second circuit portion 403 around the sensor portion 401, a difference between characteristics of the region covered with the inorganic film filter 62 and characteristics of the region not covered with the inorganic film filter 62 in the light receiving element 40 may occur.

(2) In a case where the light receiving element 40 is manufactured by a lift-off technique, since the part to be lifted off is large, the liftoff may not be completely performed.

(3) In addition to the (2) described above, if the lift-off region is large (that is, the area of the portion to be lifted off is large), the lift-off resist area becomes large and thus, angular dependence may shift depending on degas comes out of the resist.

In the photosensor 1 of the sixth embodiment, since the first circuit portion 402 and the second circuit portion 403 are covered with the inorganic film filter 62 in addition to the sensor portion 401, the influence of the stress caused by the inorganic film filter 62 on the first circuit portion 402 and the second circuit portion 403 is reduced so that the difference between the characteristics of the region covered with the inorganic film filter 62 and the characteristics of the region not covered with the inorganic film filter 62 in the light receiving element 40 can be reduced.

Since an area of the lift-off resist can be made small, it is possible to minimize the degas from the resist and to obtain a stable film quality. As a result, it becomes possible to maintain angular dependence which is the most important.

In the photosensor 1 of the sixth embodiment, the first circuit portion 402 and the second circuit portion 403 are provided as the circuit portion, but the present invention is not limited thereto. Depending on the design of the photosensor 1 or the like, the configuration, such as material, size, range, and number, of the circuit portion can be appropriately changed.

(Seventh Embodiment)

Figure 11:
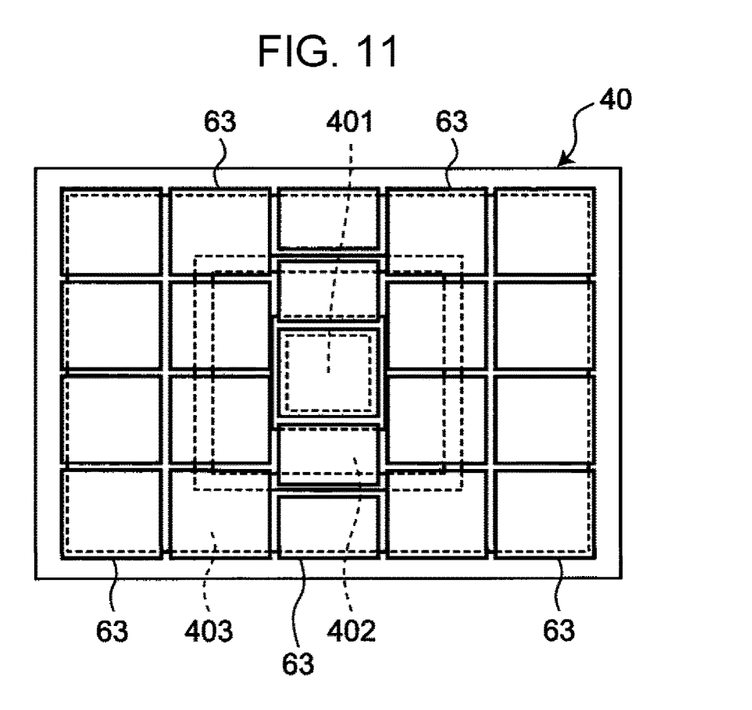
FIG. 11 is a top view of a light receiving element portion of an optical sensor of a seventh embodiment of the present invention.

The photosensor 1 of the seventh embodiment of the present invention is different from the photosensor 1 of the sixth embodiment in that as illustrated in FIG. 11, the incident light regulation portion is configured with a plurality of inorganic film filters 63 as an example of a plurality of filters.

In the photosensor of the seventh embodiment, as illustrated in FIG. 11, the incident light regulation portion is configured with 21 inorganic film filters 63 having substantially the same size. Each inorganic film filter 63 is made of, for example, Ag/Nb$_2$O$_3$ and has a substantially rectangular shape in a plan view along a direction orthogonal to the light-receiving surface 40a of the sensor portion 401. The size of each inorganic film filter 63 is smaller than that of the inorganic film filter 62 of the sixth embodiment. In addition, the respective inorganic film filters 63 are disposed so as to cover almost the entire surface of the sensor portion 401, the first circuit portion 402, and the second circuit portion 403 with a space so as not to overlap each other.

Meanwhile, like the photosensor 1 of the sixth embodiment, if the inorganic film filter 62 is disposed so as to cover the entire surface of the sensor portion 401, the first circuit portion 402, and the second circuit portion 403 of the light receiving element 40, internal stress may be generated in the incident light regulation portion (that is, the inorganic film filter 62) by heat treatment in a reflow step when the light receiving element 40 is mounted and the inorganic film filter 62 may crack.

In the photosensor 1 of the seventh embodiment, the plurality of inorganic film filters 63 are disposed with a space so as not to overlap each other, and cover substantially the entire surface of the sensor portion 401, the first circuit portion 402, and the second circuit portion 403 as a whole. With this configuration, by the plurality of inorganic film filters 63, internal stress generated in the incident light regulation portion (that is, inorganic film filters 63) by heat treatment in the reflow step when light receiving element 40 is mounted can be reduced while covering substantially the entire surface of the sensor portion 401, the first circuit portion 402, and the second circuit portion 403 of the light receiving element 40. As a result, occurrence of problems such as cracking of the inorganic film filter 62 can be avoided by the heat treatment in the reflow step when the light receiving element 40 is mounted.

Although the size of each inorganic film filter 63 can be set arbitrarily, it is possible to reduce stress due to the inorganic film filter 62 to the first circuit portion 402 and the second circuit portion 403, by setting all the inorganic film filters 63 to the same size.

The present invention and the embodiments are summarized as follows.

The optical sensor 1 of the present invention is characterized by including the light emitting element 20 that radiates light onto an object to be detected and the light receiving element 40 that has the light-receiving surface 40a for receiving light radiated from the light emitting element 20, the incident light regulation portion 60, 61 covering the light-receiving surface 40a is provided on the path along which the light radiated from the light emitting element 20 is directed toward the light-receiving surface 40a, and the incident light regulation portion 60, 61 transmits, light having the incident angle θ less than a predetermined value and blocks light having the incident angle θ greater than or equal to the predetermined value among the light incident on the light receiving element 40.

According to the configuration described above, since light reception on the light-receiving surface 40a is regulated in accordance with the incident angle θ of the light which is radiated from the light emitting element 20 and is incident on the light receiving element 40, for example, even in a case where the light emitting element 20 that radiates light having a wavelength in a predetermined band is used, it is possible to reduce the intensity of light radiated from the light emitting element 20 and is directed toward the light-receiving surface 40a without being reflected by the object to be detected. As a result, information on the object to be detected can be detected with high accuracy.

In the photosensor 1 of one embodiment, the incident light regulation portion is the etalon filter 60.

According to the embodiment described above, it is possible to eliminate the problem such as warpage by making the incident light regulation portion thin, and it is possible to suppress the cost.

In the photosensor 1 of one embodiment, the incident light regulation portion is the dielectric multilayer film 61 in which a plurality of dielectric films are laminated.

According to the embodiment described above, it is possible to design a cut-off waveform to be steep, and since a cut-off wavelength and a transmission wavelength can be clearly distinguished, the S/N ratio of the sensor can be improved.

In the photosensor 1 of one embodiment, the light receiving element 40 includes the sensor portion 401 having the light-receiving surface 40a and the circuit portion 402, 403 disposed around the sensor portion 401, and the incident light regulation portion is disposed so as to cover the sensor portion and the circuit portion.

According to the embodiment described above, the influence of the stress by the incident light regulation portion 62 on the circuit portion 402, 403 is reduced so that the difference between the characteristics of the region covered with the incident light regulation portion 62 and the characteristics of the region not covered with the incident light regulation portion 62 in the light receiving element 40 can be reduced.

Further, in the photosensor 1 of one embodiment, the incident light regulation portion is configured with a plurality of filters disposed so as not to overlap each other.

According to the embodiment described above, by the plurality of inorganic film filters 63, since internal stress generated in each filter 63 by heat treatment in the reflow step when light receiving element 40 is mounted can be reduced while covering the sensor portion 401 and the circuit portion 402, 403 of the light receiving element 40, occurrence of the problem such as cracking of the inorganic film filter 62 can be avoided.

In the photosensor 1 of one embodiment, the light emitting element 20 is a laser.

According to the embodiment described above, detection accuracy can be improved efficiently by designing the incident light regulation portion 60, 61 so that the primary reflection light directed toward the light receiving element 40 without being reflected by the object to be detected can be blocked.

It goes without saying that the constituent elements described in the first to seventh embodiments may be appropriately combined or may be appropriately selected, replaced, or deleted.

REFERENCE SIGNS LIST 1 photosensor
10 sensor substrate
11 terminal
20 light emitting element
30 light receiving unit
40 light receiving element
401 sensor portion
402 first circuit portion
403 second circuit portion
40a light-receiving surface
41 semiconductor substrate
42 N-type semiconductor layer
43 P-type semiconductor layer
44 P+ diffusion layer
45 N+ diffusion layer
46 first conductive layer
47 second conductive layer
48 third conductive layer
49 passivation film
51 light-transmitting resin
52 light-blocking resin
60 etalon filter (example of incident light regulation portion)
61 dielectric multilayer film (example of incident light regulation portion)
62, 63 inorganic film filter (example of incident light regulation portion)
70 casing
71 casing window
80 rubber cap
90 dielectric film
91 metal film
$\theta$ incident angle
$\theta_0$ regulation angle
A distance between surfaces of light receiving element and casing
B distance between centers of light emitting element and light receiving element
WR wavelength region

The invention claimed is:

1. A photosensor comprising:
   a light emitting element that radiates light onto an object to be detected, and
   a light receiving element that has a light-receiving surface for receiving light radiated from the light emitting element, wherein
   an incident light regulation portion covering the light-receiving surface is provided on a path along which the light radiated from the light emitting element is directed toward the light-receiving surface,
   the incident light regulation portion is a dielectric multilayer film in which a plurality of dielectric films are laminated and which transmits light having an incident angle less than a regulation angle and blocks light having the incident angle greater than or equal to the regulation angle among light incident on the light receiving element,
   the light receiving element includes
      a sensor portion having the light-receiving surface and
      a circuit portion formed of a single chip with the sensor portion and disposed around the sensor portion, and
      the incident light restriction portion is disposed so as to cover the sensor portion and the circuit portion and is divided between the sensor portion and the circuit portion.

2. The photosensor according to claim 1,
   wherein the incident light restricting portion is divided between at least the sensor portion and the circuit portion in a region excluding a portion covering the sensor portion and is not divided in a region covering the sensor portion.

3. The photosensor according to claim 1,
   wherein the incident light regulation portion is an etalon filter.

4. The photosensor according to claim 1,
   wherein the incident light regulation portion is configured with a plurality of filters disposed so as not to overlap each other.

5. The photosensor according to claim 1, wherein the light emitting element is a laser.

* * * * *